United States Patent [19]

Gross

[11] 4,079,336
[45] Mar. 14, 1978

[54] STACKED TRANSISTOR OUTPUT AMPLIFIER

[75] Inventor: William Harlos Gross, Sunnyvale, Calif.

[73] Assignee: National Semiconductor Corporation, Santa Clara, Calif.

[21] Appl. No.: 753,025

[22] Filed: Dec. 22, 1976

[51] Int. Cl.² ............................................. H03F 3/04
[52] U.S. Cl. .................................... 330/296; 330/311
[58] Field of Search ................... 330/17, 18, 22, 38 M

[56] References Cited

U.S. PATENT DOCUMENTS 3,668,541  6/1972  Pease .................................. 330/17 X
3,714,600  1/1973  Kuijk .................................. 330/18 X Primary Examiner—Lawrence J. Dahl
Attorney, Agent, or Firm—Gail W. Woodward; Willis E. Higgins

[57] ABSTRACT

In transistor output stages, where the applied voltage exceeds the voltage rating of available transistors, stacking is employed to divide the voltage across two or more series connected devices. A complementary emitter follower transistor is employed in the biasing of the stacking transistor along with a current source acting as the emitter follower load. This arrangement provides constant current drive for the stacking transistor without resorting to low value biasing resistors which produce excessive current flow under quiescent conditions.

10 Claims, 6 Drawing Figures

U.S. Patent     March 14, 1978     4,079,336
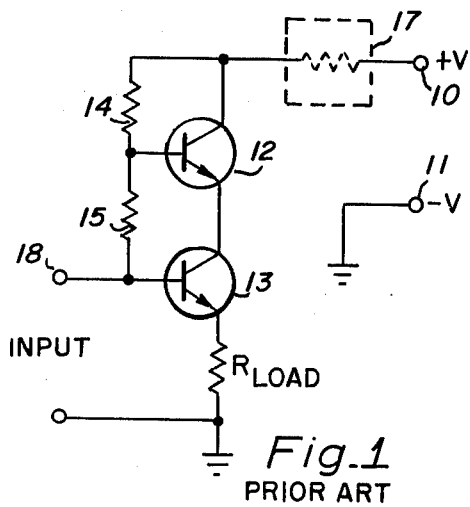
Fig_1 PRIOR ART
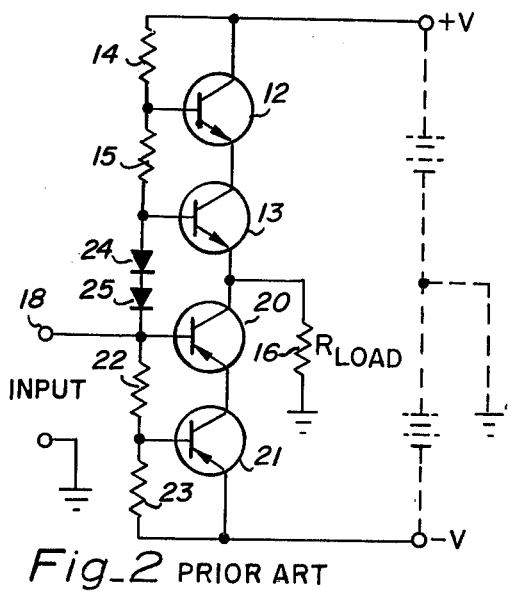
Fig_2 PRIOR ART
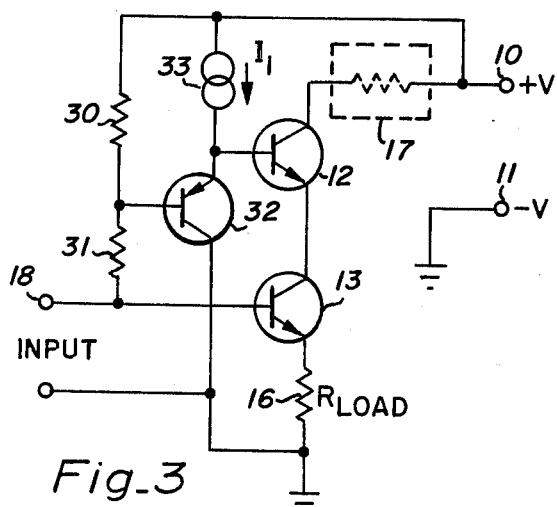
Fig_3
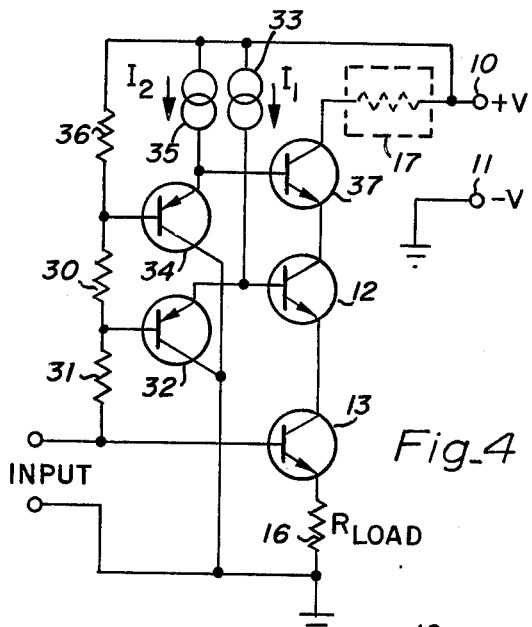
Fig_4
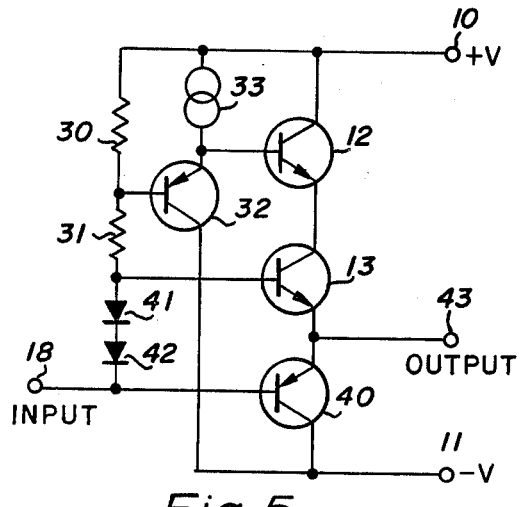
Fig_5
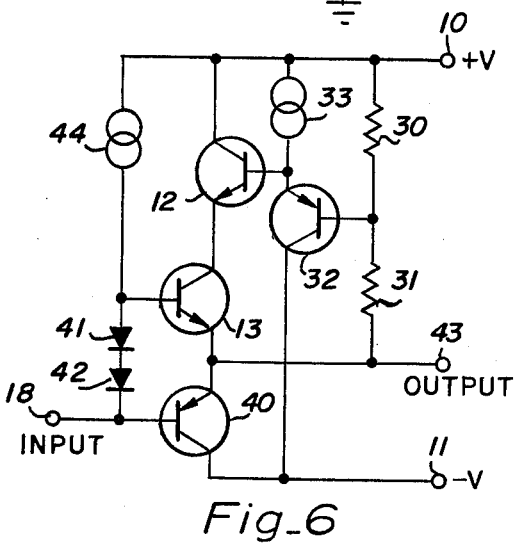
Fig_6

STACKED TRANSISTOR OUTPUT AMPLIFIER

BACKGROUND OF THE INVENTION

High voltage transistor operation is often desirable in certain circuit applications. For example, in high fidelity audio amplifiers the power output stage requires substantial power supply voltage in order to obtain the required power output. Since the driver transistors are ordinarily directly coupled to the output transistors, they too must withstand the substantial voltages involved. The power output transistors are specially made to provide the currents and voltages required to deliver a rated power level and are therefore relatively costly. Since they are required to dissipate substantial power, they are usually made in discrete form with a shape that allows suitable heat sinking. The driver transistors are desirably of more conventional construction and most desirably are incorporated into an integrated circuit (IC) along with gain stages, protective circuitry, and other related circuit functions.

Using conventional discrete transistors and IC's at the required high voltages has led to the use of stacked transistor circuits. Two or more transistors are series connected and biased so as to divide the applied voltage between the transistors. Typically the series transistors are biased from a voltage divider that consists of series connected resistors. This sort of biasing works well for operating quiescent transistors and the current flow in the divider can be made greater than the transistor base currents to obtain stable bias. However, as the transistors are driven into conduction, less current flows in the divider and the stacking transistor base current is limited. This means that very limited current drive is available in stacked transistors. For moderate output loads this means that their voltage swing capability is also limited.

SUMMARY OF THE INVENTION

It is an object of the invention to provide a biasing means for stacked transistors in which constant drive is available even at high currents where the voltage swing is such as would ordinarily reduce the drive.

It is a further object of the invention to employ an emitter follower in conjunction with a current source to bias a stacking transistor to provide constant drive thereto under large signal swing conditions.

It is a still further object of the invention to employ conventional IC fabrication using stacked transistors to produce a high voltage high signal swing output stage driver.

These and other objects are achieved in a circuit configured as follows. A plurality of similar transistors have their emitter-collector circuits series connected across a power supply having a voltage that exceeds the capabilities of a single transistor. The input signal is applied to one transistor called the signal input transistor. The other transistors (or transistor if only one is involved) are stacking transistors. The stacking transistors are biased from a complementary emitter follower transistor which has a voltage divider coupled to its base. The emitter follower load includes a constant current source. When the stacked transistors are to be driven into a high conduction state, the voltage across the combination is reduced to a low value. This reduces the emitter follower current so that the constant current source forces current into the base of the stacking transistor. This provides the high drive needed for the on state.

When the invention is used in IC form it is particularly useful in terms of stacked NPN transistors. In this configuration the emitter follower devices, as well as the complementary output devices, are of substrate collector PNP construction.

BRIEF DESCRIPTION OF THE DRAWING

FIG. 1 is a schematic diagram showing conventional prior art stacked transistors;

FIG. 2 is a schematic diagram of a prior art complementary symmetry amplifier using stacked transistors;

FIG. 3 is a schematic diagram showing two stacked transistors using the biasing arrangement of the invention;

FIG. 4 is a schematic diagram showing three stacked transistors using the biasing arrangement of the invention;

FIG. 5 is a schematic diagram of a complementary symmetry output stage employng the invention and useful in integrated circuit construction; and FIG. 6 is a schematic diagram of an alternative circuit for that of FIG. 5.

DESCRIPTION OF THE INVENTION

FIG. 1 shows a conventional prior art stacked transistor circuit in which the applied power supply voltage can exceed the breakdown voltage of a single transistor. The power supply is applied as $+V$ at terminal 10 and $-V$ at terminal 11 which is arbitrarily designated as ground. Two transistors 12 and 13 have their emitter-collector circuits coupled in series. These two transistors are biased so that the total applied voltage is divided approximately equally across the transistors so that each one can develop a maximum of $+V/2$ from emitter to collector. Biasing is achieved by resistors 14 and 15, which have approximately equal value. In moderately high voltage circuits the transistor emitter-base voltage is so small compared to the collector-base voltage that resistors 14 and 15 can be made equal for practical purposes. The input, from terminal 18, is to the base of transistor 13 referenced to ground. The output is taken across resistor 16 which constitutes the load. When resistor 16 is the load and the circuit acting as an emitter follower, the collector of transistor 12 is returned directly to $+V$. If desired, the output load can be inserted into the collector as shown in dashed outline at 17. If the load at 17 is to be employed, the load of 16 would be omitted (and the emitter of transistor 13 coupled to ground) or valued accordingly. For a paraphase system the load values at 16 and 17 would be equal. If common base operation is desired, the base of transistor 13 could be coupled to ground and the input signal applied to the emitter. In the case where emitter follower action is present, resistor 15 can be connected to the emitter of transistor 13 instead of the base as shown. If this is done, the stage input impedance is substantially increased.

FIG. 2 is the prior art version of FIG. 1 employing complementary symmetry. The upper half of the circuit is similar to that of FIG. 1, while the lower half is a mirror image of the upper. Complementary transistors 20 and 21 are series coupled to the $-V$ power supply terminal 11. The power supply midpoint is coupled to ground as shown by the dashed lines. Resistors 22 and 23 bias the lower transistors. In this circuit the upper half conducts on the positive input signal excursions at terminal 18 and the lower half conducts on the negative input signal excursions. In each case, the operative half acts as an emitter follower. Diodes 24 and 28 couple the two halves of the circuit together and provide quiescent bias that reduces crossover distortion. Other equivalent configurations are also found in the prior art.

The above described prior art circuits have a biasing problem that interferes with large signal swing characteristics. Desirably, the amplifier output signal swing should be capable of closely approaching the power supply voltage. For example, in FIG. 1 when the transistors are turned off, the potential at the emitter of transistor 13 approaches $-V$ very closely. However, when the transistors are to be turned on, it is difficult to pull the emitter of transistor 13 close to $+V$. Transistor 13 can be driven on by signal source current at terminal 18. However, transistor 12 cannot be so driven because of resistor 15. If resistor 14 is made small so that base current for transistor 12 can be obtained from $+V$, its value would be so low that excessive current would flow through the resistors at all other times. Thus the circuit must be compromised. Resistors 14 and 15 are made large enough to avoid excessive current flow through them and this means that good saturation drive current is not available so that $I_{max}$ is limited.

FIG. 3 shows the basic circuit of the invention. The various elements in common with those of FIG. 1 bear the same numbers. It can be seen that the signal transistor 13 and stacking transistor 12 are the same. The biasing is different. Equal value biasing resistors 30 and 31 are coupled from $+V$ to the base of signal transistor 13. An emitter follower transistor 32 is interposed between the juncture of resistors 30 and 31 and the base of stacking transistor 12. The collector of transistor 32 is coupled to $-V$ because transistor 32 is complementary to transistors 12 and 13. The emitter of transistor 32 is coupled to $+V$ by means of current source 33, which conducts $I_1$. $I_1$ is selected to be that value of base current that will drive transistor 12 to the desired degree of conduction. When input terminal 18 is driven negative, transistor 32 is driven into conduction so as to divert $I_1$ through transistor 32 to $-V$ (or ground). Using this configuration, resistors 30 and 31 can be made sufficiently large that their current drain is negligibly small. In terms of IC parlance, transistor 32 can be a vertical, collector-substrate, device which has good beta or current gain. This in turn means that the current requirement for resistors 30 and 31 can be $I_1$ divided by beta or several hundred times smaller.

As was described for the prior art circuit, the transistors 12 and 13 can be operated as a stacked pair in any of the three conventional stage configurations.

The invention can be applied to multiple stacking as illustrated in FIG. 4 where three transistors are coupled to a power supply having a value in excess of twice the breakdown of a single transistor. Transistors 12, 13, and 32 are as were designated in FIG. 3 as are resistors 30 and 31, and current source 33. An additional stacking transistor 37, emitter follower transistor 34, current source 35, and resistor 36 have been added. Current source 35 conduction, $I_2$, is made equal to current $I_1$ and resistors 30, 31, and 36 have substantially equal values. Clearly this stacking concept can be further extended.

The stacking concept can be usefully applied, if desired, to the complementary structure as characterized by the lower half of FIG. 2.

In IC form, the circuit of FIG. 3 is most important. Using conventional IC processing, on a p-type substrate and n-type epitaxial layer, the PNP transistors that are produced have substantially higher collector breakdown voltages than do the NPN transistors. Thus it is more significant to stack NPN output devices whereas the singly operated complementary PNP performs adequately.

FIG. 5 illustrates a complete complementary output stage for use in monolithic IC form. NPN transistors 12 and 13 are stacked to increase voltage capability and operate as a complementary symmetry amplifier with PNP transistor 40. A second PNP transistor 32 provides the emitter follower base drive for transistor 12. Both PNP devices are substrate collector types returned to $-V$ at terminal 11. This circuit operates well at supply voltages that would ordinarily break down a single NPN transistor. Resistors 30 and 31 along with current source 33 complete the stacking transistor bias circuit. Diodes 41 and 42 bias transistors 13 and 40 to reduce crossover distortion.

FIG. 6 illustrates an alternative circuit to that of FIG. 5. Resistors 30 and 31 are coupled between the $+V$ terminal 10 and output terminal 43. In addition, diodes 41 and 42 are biased on by current source 41. Otherwise the circuit of FIG. 6 operates as does that of FIG. 5. However, since any signal source coupled to terminal 18 does not have to supply the current flowing in resistors 30 and 31, the input impedance looking into terminal 18 is substantially higher.

The invention has been described with reference to several illustrative embodiments. Other modifications and equivalents will occur to a person skilled in the art. For example, in respect to FIGS. 5 and 6, a second stacked amplifier, using NPN transistors, could be connected between terminal 18 and $-V$ at terminal 11 to drive the output stage. In this case input terminal 18 would be driven as the load element for the second transistor stack with the base electrode of the signal transistor becoming the new amplifier input terminal. In this arrangement the input potential would be operated close to $-V$ potential. Furthermore, it is clear that all devices shown and described could be complementary. That is, where a PNP device is used it could be NPN so long as all NPN devices are made PNP type. In IC construction this would mean using an N-type substrate with a p-type epitaxial layer thereon. Still other equivalents and modifications are possible within the spirit and intent of the invention. Accordingly, it is intended that the invention be limited only by the following claims.

I claim:

1. A stacked transistor amplifier circuit comprising:
   a signal input transistor;
   a stacking transistor of the same conductivity type as said signal input transistor and having its emitter collector circuit coupled in series with the emitter collector circuit of said signal input transistor, said series transistor combination being coupled to terminals adapted for connection to a power supply;
   first and second bias resistors coupled together in series combination, said series resistor combination being coupled between said terminal coupled to said collector of said stacking transistor and the base of said input transistor; an emitter follower transistor of a conductivity type complementary to that of said signal input and said stacking transistors, the emitter of said emitter follower transistor being coupled to the base of said stacking transistor, the collector of said emitter follower transistor being coupled to the power supply terminal coupled to the emitter of said signal input transistor, and the base of said emitter follower transistor being coupled to the juncture of said resistors; and a constant current source coupled between the power supply terminal coupled to the collector of said stacking transistor and said emitter of said emitter follower transistor.

2. The circuit of claim 1 wherein a load element is coupled in series with said collector of said stacking transistor and an output is taken from said collector.

3. A stacked transistor amplifier circuit comprising:

a signal input transistor;

a stacking transistor of the same conductivity type as said signal input transistor and having its emitter collector circuit coupled in series with the emitter collector circuit of said signal input transistor, said series transistor combination being coupled to terminals adapted for connection to a power supply;

first and second bias resistors coupled together in series combination, said series resistor combination being coupled between said terminal coupled to the collector of said stacking transistor and the emitter of said signal input transistor;

an emitter follower transistor of a conductivity type complementary to that of said signal input and said stacking transistors, the emitter of said emitter follower transistor being coupled to the base of said stacking transistor, the collector of said emitter follower transistor being coupled to the power supply terminal coupled to the emitter of said signal input transistor, and the base of said emitter follower transistor being coupled to the juncture of said resistors; and a constant current source coupled between the power supply terminal coupled to the collector of said stacking transistor and said emitter of said emitter following transistor.

4. The circuit of claim 3 wherein a load element is coupled in series with said emitter of said signal input transistor and an output is taken from said emitter.

5. The circuit of claim 3 wherein a load element is coupled in series with said collector of said stacking transistor, input signal means coupled to said emitter of said signal input transistor, and said base of said signal input transistor is coupled to a source of reference potential.

6. A monolithic integrated circuit amplifier structure comprising in combination:

first and second NPN transistors having their emitter collector circuits coupled in series, said series coupled NPN transistors coupled between a signal output terminal and a terminal adapted for connection to the positive terminal of an operating power supply;

a first PNP transistor having the collector coupled to a terminal adapted for connection the negative terminal of said power supply, the emitter coupled to said output terminal, and the base coupled to a signal input terminal;

a second PNP transistor having the collector coupled to said terminal adapted for connection to said negative power supply terminal, the emitter coupled to the base of said first NPN transistor, and the base coupled to biasing means operative to maintain the voltage at said emitter of said second PNP transistor approximately midway between the potentials at said output terminal and said positive power supply terminal;

a current source coupled between said emitter of said second PNP transistor and said positive power supply terminal; and means for biasing the base electrode of said second NPN transistor relative to the base electrode of said first PNP transistor to establish the operating conditions of said amplifier.

7. The structure of claim 6 wherein said PNP transistors are vertical substrate collector devices and said NPN transistors are vertical isolated collector devices.

8. The structure of claim 6 wherein each recited transistor is replaced by its complement and said power supply polarities are reversed.

9. The structure of claim 6 wherein said means for biasing comprise:

a pair of resistor elements coupled in series between said base of said second NPN transistor and said positive terminal of said power supply, the juncture of said resistors being coupled to said base of said first NPN transistor.

10. The structure of claim 6 wherein said means for biasing comprise:

a pair of resistors coupled in series between said emitter of said second NPN transistor and said positive terminal of said power supply, the juncture of said resistors being coupled to said base of said first NPN transistor.

* * * * *